United States Patent
Krah et al.

(10) Patent No.: US 9,638,722 B2
(45) Date of Patent: May 2, 2017

(54) CURRENT SENSOR AND CONTROL CIRCUIT

(71) Applicant: Deere & Company, Moline, IL (US)

(72) Inventors: Jens Onno Krah, Wuppertal (DE); Ronnie D. Stahlhut, Bettendorf, IA (US)

(73) Assignee: DEERE & COMPANY, Moline, IL (US)

( * ) Notice: Subject to any disclaimer, the term of this patent is extended or adjusted under 35 U.S.C. 154(b) by 153 days.

(21) Appl. No.: 14/566,950

(22) Filed: Dec. 11, 2014

(65) Prior Publication Data

US 2015/0219692 A1 Aug. 6, 2015

(30) Foreign Application Priority Data

Dec. 11, 2013 (DE) .......................... 10 2013 225 645

(51) Int. Cl.
*G01R 15/20* (2006.01)
*G01R 33/00* (2006.01)
(Continued)

(52) U.S. Cl.
CPC ......... *G01R 15/202* (2013.01); *G01R 15/181* (2013.01); *G01R 15/207* (2013.01);
(Continued)

(58) Field of Classification Search
None
See application file for complete search history.

(56) References Cited

U.S. PATENT DOCUMENTS

| 4,961,049 A | 10/1990 | Ghislanzoni |
| 5,041,780 A | 8/1991 | Rippel |

(Continued)

FOREIGN PATENT DOCUMENTS

| DE | 10062292 A1 | 3/2002 |
| DE | 102008030411 A1 | 1/2009 |

(Continued)

OTHER PUBLICATIONS

European Search Report issued in counterpart application No. 14190196.7, dated Apr. 22, 2015 (10 pages).

(Continued)

*Primary Examiner* — Paresh Patel
(74) *Attorney, Agent, or Firm* — Taft Stettinius & Hollister LLP; Stephen E Rost

(57) ABSTRACT

A current sensor includes an induction coil, a Hall sensor, and a calibration coil loaded by a generator continuously with a calibration current of defined frequency $\omega_{cal}$. A first evaluation circuit is loaded with the induction signal. A second evaluation circuit, whose input receives the Hall signal, includes a low-pass filter. A third evaluation circuit evaluates a part of the Hall signal that is attributed to the calibration current and uses it for defining a parameter of the second evaluation circuit. A fourth evaluation circuit generates an output signal that represents the current magnitude and is the sum of the output signal of the first evaluation circuit and the output signal of the second evaluation circuit minus the part of the output signal of the second evaluation circuit which is attributed to the calibration current.

10 Claims, 2 Drawing Sheets

(51) Int. Cl.
*G01R 15/18* (2006.01)
*G01R 15/14* (2006.01)

(52) U.S. Cl.
CPC ..... *G01R 33/0017* (2013.01); *G01R 33/0029* (2013.01); *G01R 33/0035* (2013.01); *G01R 33/0082* (2013.01); *G01R 15/148* (2013.01)

(56) References Cited

U.S. PATENT DOCUMENTS

| | | | |
|---|---|---|---|
| 6,366,076 B1 | 4/2002 | Karrer et al. | |
| 7,605,580 B2 * | 10/2009 | Strzalkowski | G01R 15/181 324/117 H |
| 2012/0001617 A1 | 1/2012 | Reynolds | |

FOREIGN PATENT DOCUMENTS

| | | | |
|---|---|---|---|
| EP | 2400309 A1 | | 12/2011 |
| JP | 04318472 A | | 11/1992 |
| SI | 9800063 A | * | 10/1999 |
| WO | 2008107773 A1 | | 9/2008 |

OTHER PUBLICATIONS

Simon, P.L.C et al. Autocalibration of Silicon Hall Devices. Institution of Electrical and Electronics Engineers, Jun. 25-29, 1995, pp. 237-240 [online], [retrieved on May 11, 2015]. Retrieved from the Internet <URL: http://ieeexplore.ieee.org/xpl/articleDetails.jsp?arnumber=721789> <DOI: 10.1109/SENSOR.1995.721789>.

\* cited by examiner

CURRENT SENSOR AND CONTROL CIRCUIT

TECHNICAL FIELD

The present disclosure relates to a current sensor for detecting the current magnitude of a current flowing through a conductor and also to a control circuit with such a current sensor.

BACKGROUND

To detect the current magnitude of a current flowing through a conductor, in addition to shunt resistors that are subject to the disadvantages of energy losses and the lack of potential separation, current sensors are also known that detect the magnetic field generated by the current flowing in the conductor. For this purpose, in particular, Hall sensors and induction coils are used in the prior art.

Hall sensors are based on the Hall effect, wherein a current flowing in a solid body (usually a semiconductor crystal) is deflected by the Lorentz force perpendicular to the current and magnetic field direction. They can also detect direct currents. One weakness of Hall sensors, however, is a relatively high noise component in the signal, especially at higher frequencies. In addition, Hall voltages are dependent on temperature, because the offset (output voltage when there is no magnetic field) and the sensitivity or amplification (output voltage per magnetic flux) change as a function of the respective temperature of the Hall sensor.

In contrast, induction coils detect the change in the magnetic field over time. By nature they are not suitable for detecting direct currents.

In the prior art, it was proposed to equip current sensors with combinations of Hall sensors and induction coils:

According to SI 98 00 063 A, a Hall sensor and an induction coil are arranged adjacent to a conductor. The signals of the Hall sensor are passed through a low-pass filter, while the signals of the induction coil are integrated in time and passed through a high-pass filter. The time constants of the high-pass and low-pass filters match. The output signals of the low-pass and high-pass signals are summed together. The low-frequency components of the current through the conductor are thus detected by the Hall sensor and the high-frequency components are detected by the induction coil. Here, there is nevertheless the problem of the temperature dependency of the sensitivity and the offset of the Hall sensor.

DE 10 2008 030 411 A1 likewise uses a Hall sensor and an induction coil, in order to detect the magnetic field of a conductor constructed as a coil. The signals of the Hall sensor are fed to a low-pass filter and also the signals of the induction coil are passed through a low-pass filter. The output signals of both low-pass filters are each added together after multiplication with an associated weighting factor. Another coil adjacent to the Hall sensor is connected to a control unit. If there is no measurement current in the conductor, the additional coil (or the induction coil) is loaded with a current, in order to calculate the offset and amplification error using the output voltage of the Hall sensor that is then produced, and these values are then considered in the signal processing. In addition, a temperature sensor can measure a possible change in temperature, in order to compensate for a resulting drift in the offset or the sensitivity of the Hall sensor. The temperature sensor increases the complexity and requires a precise calibration for compensating for the temperature dependency of the signals of the Hall sensor, while loading the Hall sensor with the magnetic field of the additional coil or the induction coil is possible only when there is no measurement current and thus it is not possible continuously.

Thus, it is desired to provide an improved current sensor.

SUMMARY

According to an aspect of the present disclosure, a current sensor for detecting the current magnitude of a current flowing through a conductor includes an induction coil that is allocated to the conductor and provides an induction signal proportional to the time derivation of the current magnitude, a Hall sensor that is allocated to the conductor and provides a Hall signal proportional to the current magnitude, and a calibration coil that is allocated to the Hall sensor and can be loaded by a generator continuously with a calibration current of defined frequency, which causes a defined magnetic field in the Hall sensor. The input of a first evaluation circuit is connected to the induction coil and thus receives the induction signal. The input of a second evaluation circuit that comprises a low-pass filter is connected to the Hall sensor and receives the Hall signal. A third evaluation circuit evaluates, during operation, a part of the Hall signal that can be attributed to the calibration current and uses the latter for defining a parameter of the second evaluation circuit. A fourth evaluation circuit is used for generating an output signal that represents the current magnitude and is the sum of the output signal of the first evaluation circuit and the output signal of the second evaluation circuit minus the part of the output signal of the second evaluation circuit that can be attributed to the calibration current. For this purpose, the fourth evaluation circuit subtracts the part of the output signal of the second evaluation that can be attributed to the calibration current from the output signal of the second evaluation and includes an adder for summing the output signals of the first evaluation circuit and the result of the subtraction. The output signal of the adder represents the current magnitude of the current flowing through the conductor.

In other words, the magnetic field that generates the current through the conductor is detected by two sensors, namely by the induction coil and the Hall sensor. The noise component of the signal of the Hall sensor is separated by a low-pass filter of the second evaluation circuit, so that the output of the second evaluation circuit represents only the direct-current component and the low-frequency component of the current. To compensate for the mentioned temperature-dependent parameter of the Hall sensor, an additional calibration coil is loaded by a generator with a calibration current at a defined frequency. A magnetic field that is detected by the Hall sensor is generated by the calibration coil. With a known calibration current, a certain, known Hall signal is also to be expected. The measured Hall signal might also deviate from this expected signal, however, due to thermal effects or aging of the Hall sensor, among other things. A third evaluation circuit extracts from the signal of the Hall sensor the component that can be traced back to the calibration current. Here, in particular, the amplitude and phase position of the mentioned component of the signal of the Hall sensor can be detected from which the sensitivity and/or the offset of the Hall sensor can be derived. Using the evaluated magnitudes of the component—preferably in comparison with the magnitudes to be expected—a parameter of the second evaluation circuit is defined. For example, the amplification of the second evaluation circuit can depend on the evaluated sensitivity of the Hall sensor, in order to compensate for an unexpected high or low sensitivity.

Optionally, the evaluated offset of the Hall sensor (i.e., the voltage applied to it, if no magnetic field is present) can be compensated in analog, by a corresponding value being subtracted from the input or output signal of the second evaluation circuit.

So that the calibration current does not distort the simultaneously running measurement of the current magnitude through the conductor, the fourth evaluation circuit is provided that subtracts the part of the output signal of the second evaluation circuit that can be attributed to the calibration current from the output signal of the second evaluation circuit. On the output of the subtractor of the fourth evaluation circuit provided for this purpose, the calibration signal thus has been removed, so that a non-distorted, low-pass-filtered Hall signal is provided there. This signal is summed by an adder with the output signal of a first evaluation circuit that is loaded on the input side with the signal of the induction coil. The output signal of the adder is also the output signal of the current sensor. There is also the possibility to first add the signals of the first and second evaluation circuits and then to subtract the part of the output signal of the second evaluation circuit that can be attributed to the calibration current.

This arrangement produces a current sensor that is sensitive down into the direct current range and has a large bandwidth despite a relatively small noise component and can be compensated automatically and continuously, i.e., also during the measurement, for the aging and temperature effects of the Hall sensor.

For a preferred embodiment, the first evaluation circuit comprises an integrator and a high-pass filter. Integration has the result that the output signal of the first evaluation circuit is no longer proportional to the time derivation of the magnetic field, but also directly to the magnetic field and thus the current magnitude through the conductor. The signals of the induction coil and the Hall sensor can then be added without a problem by the adder. However, it would also be conceivable to equip the first evaluation circuit only with a low-pass filter, corresponding to the procedure according to DE 10 2008 030 411 A1.

The parameter of the second evaluation circuit defined by the third evaluation circuit can be, as already mentioned, the sensitivity of the Hall sensor. There is also the possibility to evaluate the transfer function of the Hall sensor by the third evaluation circuit and to take this into account in the second evaluation circuit.

The calibration current is preferably purely sinusoidal. Its frequency is, in particular, below the transmission frequency of the low-pass filter of the second evaluation circuit, so that the part of the output signal of the second evaluation circuit that can be traced back to the calibration current (i.e., on the output of the second evaluation circuit) can be detected by the third evaluation circuit.

The transfer functions of the high-pass filter of the first evaluation circuit and the low-pass filter of the second evaluation circuit are preferably dimensioned such that their sum equals 1. In this way, a flat frequency response of the current sensor is achieved.

The third evaluation circuit can perform a discrete Fourier transform for the purpose of evaluating the part of the output signal of the second evaluation circuit that can be attributed to the calibration current.

The induction coil and the calibration coil can surround a ring core that surrounds the conductor concentrically and has a gap in which the Hall sensor is arranged. The mentioned coils can have one complete winding or multiple windings. The Hall sensor, the ring core, and the two induction coils can be mounted on a single circuit board. Alternatively, the conductor, the Hall sensor, and the induction coils can be integrated on a chip (monolithically), in particular, if the ring core is eliminated.

The described current sensor is suitable, in particular, for use in a control circuit for controlling a load in which the current in a conductor leading to the load is detected with a current sensor according to the invention and the output signal of the current sensor is fed to the control circuit. If the load is powered by three phase-offset conductors (e.g., for a three-phase alternating current motor), with a current sensor being allocated to each of these conductors, the calibration coils of all three current sensors can be connected in series. Thus only a single generator is required for all three current sensors.

DETAILED DESCRIPTION OF THE DRAWINGS

Figure 1:
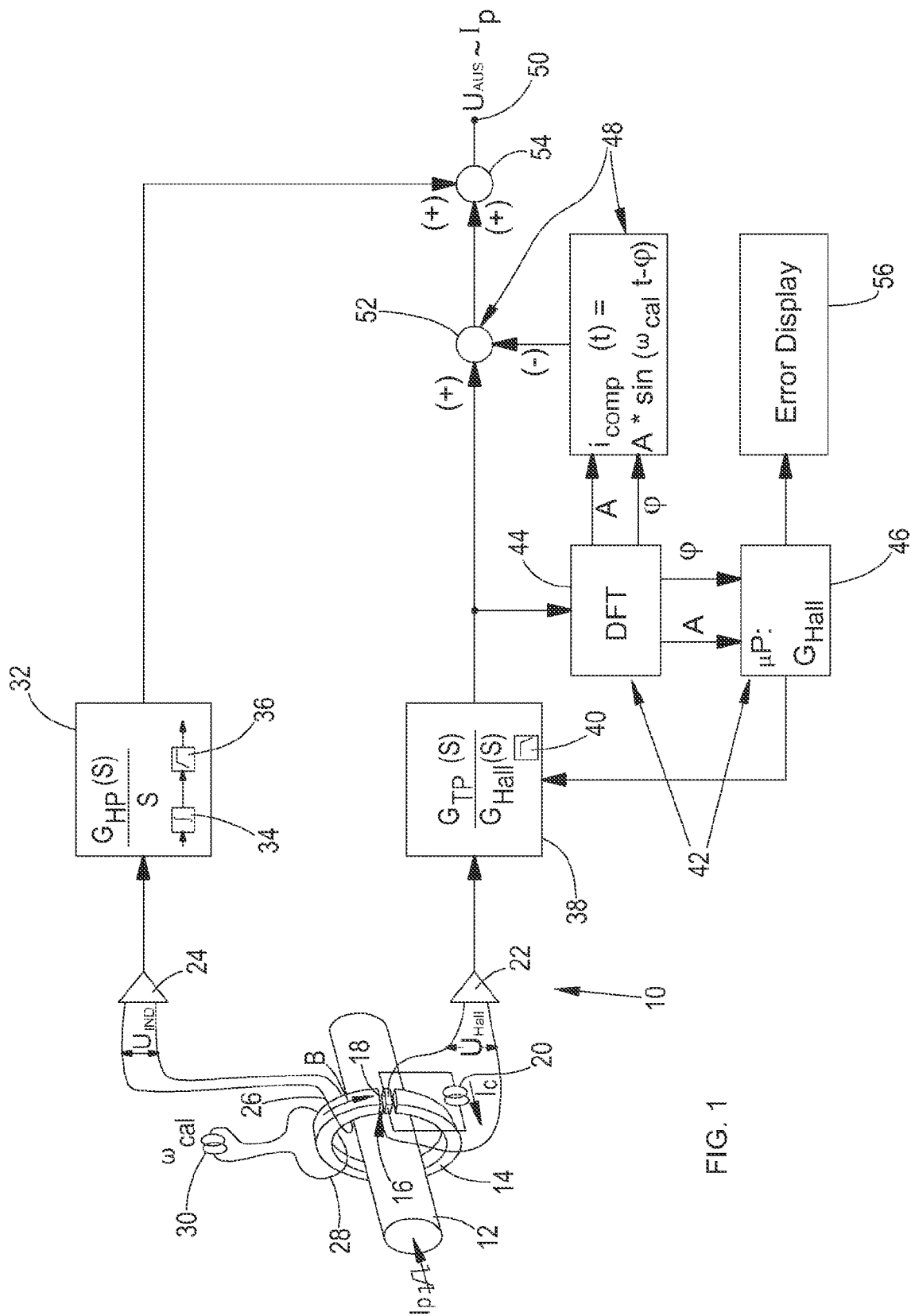
FIG. 1 is a schematic drawing of a current sensor.
Figure 2:
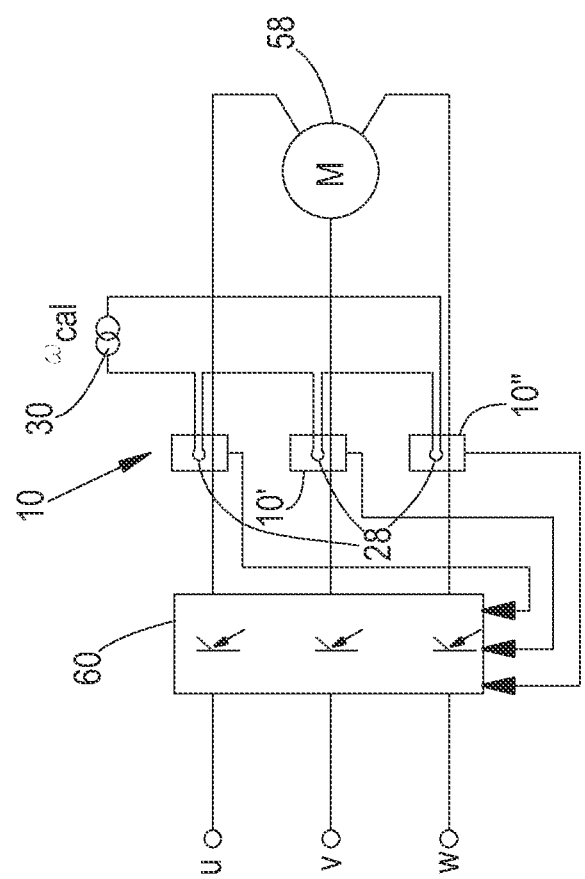
FIG. 2 is a schematic diagram of a control circuit for controlling a load with three current sensors.

At least one example embodiment of the subject matter of this disclosure is understood by referring to FIGS. 1 and 2 of the drawings.

FIG. 1 shows a current sensor 10 which detects the current magnitude or intensity $I_P$ of an electrical current through a conductor 12. Around the conductor, a ring core 14 is arranged concentrically and this ring core has a gap 16 in which a Hall sensor 18 is positioned. The Hall sensor 18 is preferably a semiconductor crystal that is loaded by a current source 20 with a constant, fixed current $I_C$ that flows through the Hall sensor 18 in a direction parallel to the conductor 12. The Hall voltage $U_H$ is removed at the radially inner and outer surfaces of the Hall sensor 18 and fed to a first amplifier 22.

Wrapped around the ring core 14 is also an induction coil 26 that has, in the illustrated embodiment, a single coil, although it could also be only a fraction of a coil or multiple coils. The output signal of the induction coil 26 is fed to a second amplifier 24.

In addition, a calibration coil 28 is arranged around the ring core 14, and this coil has, in the illustrated embodiment, a single winding, although it could also have only a fraction of a winding or multiple windings. The calibration coil 28 is loaded by an alternating current source 30 continuously with a purely sinusoidal alternating current $\omega_{cal}$ of defined frequency and amplitude.

The output signal of the second amplifier 24 is fed to a first evaluation circuit 32 that comprises an integrator 34 and a high-pass filter 36. The transfer function of the first evaluation circuit 32 can be described in the Laplace domain (i.e., in the frequency domain) by $G_{HP}(s)/s$, where $1/s$ is the integration by the integrator and $G_{HP}(s)$ is the transmission function of the high-pass filter 36.

The output signal of the first amplifier 22 is fed to a second evaluation circuit 38 that comprises a low-pass filter 40. The transfer function of the second evaluation circuit can be described in the Laplace domain by $G_{TP}(s)/G_{Hall}(s)$. Here, $G_{TP}(s)$ is the transfer function of the low-pass filter. By multiplying with $1/G_{Hall}(s)$, i.e., the reciprocal of the (known) transfer function of the Hall sensor 18, its transmission properties (frequency response, sensitivity, offset)

can be compensated. The sum of the transfer functions $G_{TP}(s)$ of the low-pass filter and $G_{HP}(s)$ of the high-pass filter is preferably equal to 1.

The output signal of the second evaluation circuit 38 is fed to a third evaluation circuit 42 that is assembled from a discrete Fourier transform circuit 44 and an evaluator 46. The discrete Fourier transform circuit 44 extracts (by means of a corresponding Fourier transform) the signal components of the output voltage of the second evaluation circuit 38 that can be attributed to the alternating current $\omega_{cal}$ through the calibration coil 28. These signal components are sent in the form of a signal with respect to the amplitude A and the phase $\phi$ of the signal component to be traced back to the calibration signal to a fourth evaluation circuit 48 and to the evaluator 46. The evaluator 46 determines, using these signals (amplitude A and the phase $\phi$ of the signal component of the output signal of the second evaluation circuit 38 that can be traced back to the calibration signal), the transfer function $G_{Hall}$ of the Hall sensor 18, in particular, its sensitivity and offset, preferably also its frequency response. This transfer function or parameters of this function are sent by the evaluator 46 to the second evaluation circuit 38 that continuously adapts its own transfer function to the parameters obtained by the evaluator 46. In this way, the evaluator 46 compares the signals of the Hall sensor 18 with expected signals and compensates for possible temperature dependencies and/or aging effects of the Hall sensor 18.

The evaluator 46 is also connected to an error indicator 56 that is then activated when the signal components of the output voltage of the second evaluation circuit 38 (or a parameter derived from these components) that can be attributed to the alternating current $\omega_{cal}$ through the calibration coil 28 deviate from the expected values by more than one threshold value. In this way, it can be determined, for example, if the Hall sensor 18 or the first amplifier 22 or the second evaluation circuit 38 might be defective. The current sensor 10 would then deliver an incorrect output voltage that has the result, in the most unfavorable case, that a controller loads a load with too high a current and damages or destroys this load. The error indicator 56 can send a signal to the controller that then regulates the load.

To prevent the alternating current $\omega_{cal}$ from reaching the output 50 of the current sensor 10, the fourth evaluation circuit 48 is provided. It generates an output value $I_{comp}(t) = A \sin(\omega_{cal} t - \phi)$ that is fed to a subtractor 52 that subtracts this output value from the output voltage of the second evaluation circuit 38. Consequently, a voltage that corresponds to the output signal of the Hall sensor 18 is provided on the output of the subtractor 52 from which, however, the signal components to be traced back to the calibration coil 28 have been removed.

The output voltages of the subtractor 52 and the first evaluation circuit 32 are added by an adder 54 (likewise belonging to the fourth evaluation circuit 32) on whose output 50 the output voltage proportional to the current $I_P$ to be detected through the conductor 12 is finally provided.

The frequency of the alternating current $W_{cal}$ is lower than the transmission frequency of the low-pass filter 36, so that the alternating current $W_{cal}$ is not detectable in the output signal of the first evaluation circuit 32.

The illustrated components of the current sensor 10 can be analog or digital components. Instead of operating, as shown here, in the time domain, they could also operate in the frequency domain (after a Fourier transform) and finally transformed back into the time domain.

The functioning of the current sensor 10 is described below. The current $I_P$ in the conductor generates, in the ring core 14, a magnetic flux B, whose direct-current and low-frequency components are detected by the Hall sensor 18. The output signal of the Hall sensor 18 is amplified in the first amplifier 22 and led into the second evaluation circuit 38 through the low-pass filter 40. The second evaluation circuit 38 also compensates the transmission function $G_{Hall}$ of the Hall sensor 18. The latter (including the sensitivity and the offset of the Hall sensor 18) is generated using the calibration signal of the generator 30 that generates, by the calibration coil 28, a known magnetic field in the ring core 14 evaluated by the third evaluation circuit 42 and is used for the automatic setting of parameters of the second evaluation circuit 38. The signal components that can be traced back to the generator 30 in the output signal of the second evaluation circuit 38 are removed by means of the fourth evaluation circuit 48 and added subsequently (or in advance) to the output signals of the first evaluation circuit 32, which integrates the output signals of the induction coil 26 with respect to time and leads them through a high-pass filter 36. In this way, the low-frequency signal components detected by the Hall sensor 18 and the high-frequency signal components detected by the induction coil 26 are combined, in order to achieve a flat and temperature-independent frequency response of the current sensor 10.

The current sensor 10 according to the invention can be used, in particular, for controlling drives. FIG. 2 shows an embodiment in which a three-phase alternating current motor 58 is powered by a controller 60. In each connection line of the three-phase alternating current motor 58, a current sensor 10, 10' or 10" is inserted whose outputs 50 are each fed back as feedback signals to the controller 60. The calibration coils 28 of the current sensors 10, 10', 10" are connected in series and are loaded by a single alternating current source 30. Because the rate of change of the sum of the currents in the connection lines of the three-phase alternating current motor 58 is small (according to Kirchhoff's junction rule even equal to zero), no significant counter-EMF is induced by these currents in the calibration coils 28, which allows the use of relatively small voltages for generating the reference current and enables a relatively simple construction of the generator 30.

What is claimed is:

1. A current sensor for detecting a magnitude of a current flowing through a conductor, comprising:
   an induction coil associated with the conductor, the induction coil providing an induction signal proportional to the time derivative of the current magnitude;
   a Hall sensor associated with the conductor, the Hall sensor providing a Hall signal proportional to the current magnitude;
   a calibration coil associated with the Hall sensor, the calibration coil being loaded by a generator continuously with a calibration current of defined frequency so that the calibration coil creates a defined magnetic field in the Hall sensor;
   a first evaluation circuit having an input which receives the induction signal;
   a second evaluation circuit with a low-pass filter having an input which receives the Hall signal;
   a third evaluation circuit which evaluates a part of the Hall signal which is attributed to the calibration current, and which defines a parameter of the second evaluation circuit; and
   a fourth evaluation circuit for generating an output signal that represents the current magnitude and is the sum of an output signal of the first evaluation circuit and an output signal of the second evaluation circuit minus the part of the output signal of the second evaluation circuit which is attributed to the calibration current.

2. The current sensor of claim 1, wherein:
the first evaluation circuit comprises an integrator and a high-pass filter.

3. The current sensor of claim 1, wherein:
the parameter of the second evaluation circuit defined by the third evaluation circuit is a transfer function of the Hall sensor.

4. The current sensor of claim 1, wherein:
the calibration current is sinusoidal.

5. The current sensor of claim 1, wherein:
the frequency of the calibration current is below the transmission frequency of the low-pass filter of the second evaluation circuit.

6. The current sensor of claim 2, wherein:
a sum of the transfer functions of the high-pass filter of the first evaluation circuit and the low-pass filter of the second evaluation circuit equals 1.

7. The current sensor of claim 1, wherein:
the third evaluation circuit performs a discrete Fourier transform for evaluating the part of the output signal of the second evaluation circuit which is attributed to the calibration current.

8. The current sensor of claim 1, wherein:
the induction coil and the calibration coil are arranged on a surrounding ring core which is concentric to the conductor and which has a gap in which the Hall sensor is arranged.

9. The current sensor of claim 1, wherein:
the current sensor is part of a control circuit for controlling a load.

10. The current sensor of claim 9, wherein:
the load is powered by three phase-offset conductors, and a current sensor is allocated to each of the conductors, and each current sensor having a calibration coil, said calibration coils being connected in series.

* * * * *